United States Patent [19]
Nishiyama

[11] Patent Number: 5,256,983
[45] Date of Patent: Oct. 26, 1993

[54] WIDE BAND AMPLIFIER

[75] Inventor: Seiichi Nishiyama, Kanagawa, Japan

[73] Assignee: Sony Corporation, Tokyo, Japan

[21] Appl. No.: 775,838

[22] Filed: Oct. 15, 1991

[30] Foreign Application Priority Data

Oct. 15, 1990 [JP] Japan .................. 2-277056

[51] Int. Cl.$^5$ .......................... H03F 3/45; H03G 3/30
[52] U.S. Cl. ..................................... 330/254; 330/252
[58] Field of Search .................................. 330/254, 252

[56] References Cited

U.S. PATENT DOCUMENTS 3,512,096  5/1970  Nagata et al. ...................... 330/285

FOREIGN PATENT DOCUMENTS

2723750  12/1978  Fed. Rep. of Germany ...... 330/254
1330403   5/1989  Japan ................................. 330/254
1320910   6/1973  United Kingdom ............... 330/254

Primary Examiner—James B. Mullins
Attorney, Agent, or Firm—Hill, Steadman & Simpson

[57] ABSTRACT

Disclosed is a wide band amplifier comprising a first differential connection circuit made of a first and a second transistor differentially interconnected, a second differential connection circuit made of a third and a fourth transistor differentially interconnected, and a level shift circuit interposingly provided between a load resistance and a power supply. The load resistance is connected to the collector of the first transistor. The bases of the first and the third transistors are supplied with a voltage for gain determination. Furthermore, the bases of the first and the third transistors are supplied with a predetermined operating voltage. The voltage of the level shift circuit is fed to the collector of the fourth transistor. In this setup, the voltage to the load resistance connected to the collector of the first transistor is varied depending on the magnitude of the current flowing through the fourth transistor.

5 Claims, 10 Drawing Sheets

WIDE BAND AMPLIFIER

BACKGROUND OF THE INVENTION

1. Field of the Invention

The present invention relates to a wide band amplifier and, more particularly, to a wide band amplifier which provides an extensive band width for amplification and which can vary its gain.

2. Description of the Prior Art

Figure 1:
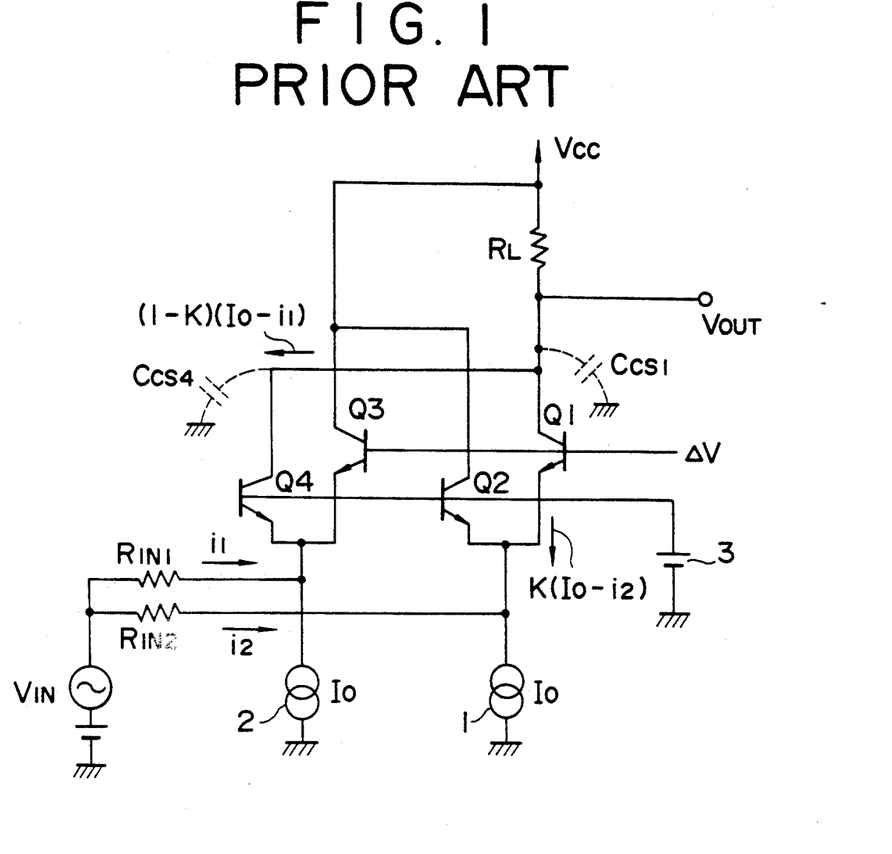
FIG. 1 is a circuit diagram of a first prior art wide band amplifier circuit.

FIG. 1 shows a circuit diagram of a conventional wide band amplifier capable of varying its gain. This wide band amplifier has four transistors Q1 through Q4. The transistors Q1 and Q2 are differentially connected, and so are the transistors Q3 and Q4.

The collector of the transistor Q1 and that of the transistor Q4 are connected to a power supply $V_{CC}$ via a load resistance RL. The collector of the transistor Q2 is connected to that of the transistor Q3, while the collector of the transistor Q4 is connected to that of the transistor Q1. The transistors Q1 and Q2 have their emitters commonly connected to a constant current source 1. Likewise, the transistors Q3 and Q4 have their emitters commonly connected to a constant current source 2. The base of the transistor Q2 and that of the transistor Q4 are connected to a bias supply 3. The voltage $\Delta V$ that determines the gain of this amplifier is supplied to the bases of the transistors Q1 and Q3. It follows that changing the voltage $\Delta V$ varies the gain of the amplifier. In the description that follows, the voltage $\Delta V$ will be replaced by a constant K.

A signal voltage $V_{IN}$ is fed to the emitters of the transistors Q3 and Q4 via a first resistor $R_{IN1}$ and to the emitters of the transistors Q1 and Q2 through a second resistor $R_{IN2}$. An amplified output $V_{OUT}$ is retrieved from the collector of the transistor Q1. A collector capacitance $C_{CS1}$ is interposed between the collector of the transistor Q1 and the substrate. Likewise, a collector capacitance $C_{CS4}$ is interposingly provided between the collector of the transistor Q4 and the substrate.

The wide band amplifier of the above construction work as follows:

Applying a signal voltage $V_{IN}$ causes a current $i_1$ and a current $i_2$ to flow through the first resistor $R_{IN1}$ and the second resistor $R_{IN2}$, respectively. If a current $I_0$ flows through the constant current sources 1 and 2, another current $K(I_0 - i_2)$ flows through the emitter of the transistor Q1, and yet another current $(1-K) \cdot (I_0 - i_1)$ through the collector of the transistor Q4. The amplified output $V_{OUT}$ of the circuit operating in the above manner is given as $$V_{OUT} = V_{CC} - RL\{(1-K) \cdot (I_0 - i_1) + K(I_0 - i_2)\} \quad (1)$$
$$= V_{CC} + RL\{-I_0 + (1-K)i_1 + Ki_2\}$$

An alternate-current gain G is obtained as $$G = V_{OUT}/V_{IN} \quad (2)$$
$$= RL\{K/R_{IN2} + (1-K)/R_{IN1}\}$$

When K=0, the minimum gain $M_{IN}G$ is given as $$M_{IN}G = RL/R_{IN1}$$

When K=1, the maximum gain $M_{AX}G$ is provided as $$M_{AX}G = RL/R_{IN2}$$

where, $R_{IN2} < R_{IN1}$.

Figure 2:
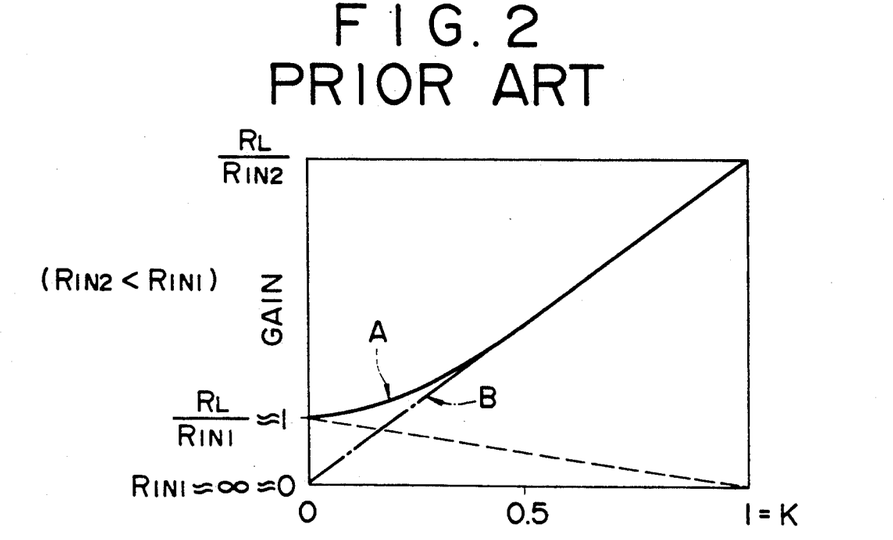
FIG. 2 is a view showing the gain characteristic of the prior art amplifier circuit in FIG. 1.

When the value of the constant K falls within a range of $$0 \leq K \leq 1$$

the gain characteristic turns out to be as depicted by a solid line curve A in FIG. 2. In the circuit of FIG. 1, the resistor $R_{IN1}$ is installed so as to determine the minimum gain. Illustratively, when the resistor $R_{IN1}$ is provided in the form of the load resistance RL, the gain is available multiplied by 1 ($=RL/RL_1$) up to $RL/R_{IN2}$. If the resistor $R_{IN1}$ is not provided, the gain is available multiplied by 0 up to $RL/R_{IN2}$, the characteristic of the gain being shown by a broken line curve B in FIG. 2. (Internal resistance $r_e$ of the transistor Q4 is ignored here).

In the wide band amplifier of FIG. 1, the frequency characteristic thereof is determined by the output load resistance RL and by the collector capacitances $C_{CS1}$ and $C_{CS4}$ added to the collectors of the transistors Q1 and Q4.

That is, when $C_{CS1} = C_{CS4} = C_{CS}$, the frequency characteristic $f_C$ of the circuit in FIG. 1 is given as $$f_C = \tfrac{1}{2}\pi(2 \cdot C_{CS})RL \quad (3)$$

With this wide band amplifier, an attempt to extend the frequency characteristic $f_C$ with no change in the maximum gain G ($RL/R_{IN2}$) would require either reducing the collector capacitance $C_{CS}$ (from equation (3)) or lowering both the input resistance value $R_{IN1}$ and the load resistance RL.

However, as far as the NPN transistor arrangement is concerned, the semiconductor device manufacturing process necessarily puts constraints on the ways to reduce the collector capacitance $C_{CS}$.

The frequency $f_C$ may be extended with no change in the gain by making the input resistance value $R_{IN2}$ and the load resistance RL smaller. But reducing the input resistance value $R_{IN}$ narrows the dynamic range of the input signal $V_{IN}$ that is determined by the input resistance value $R_{IN}$ and by the current $I_0$ flowing across the collector C to the emitter E of the transistor Q1. Thus to keep the dynamic range of the input signal $V_{IN}$ intact would require raising the current $I_0$.

Figure 8:
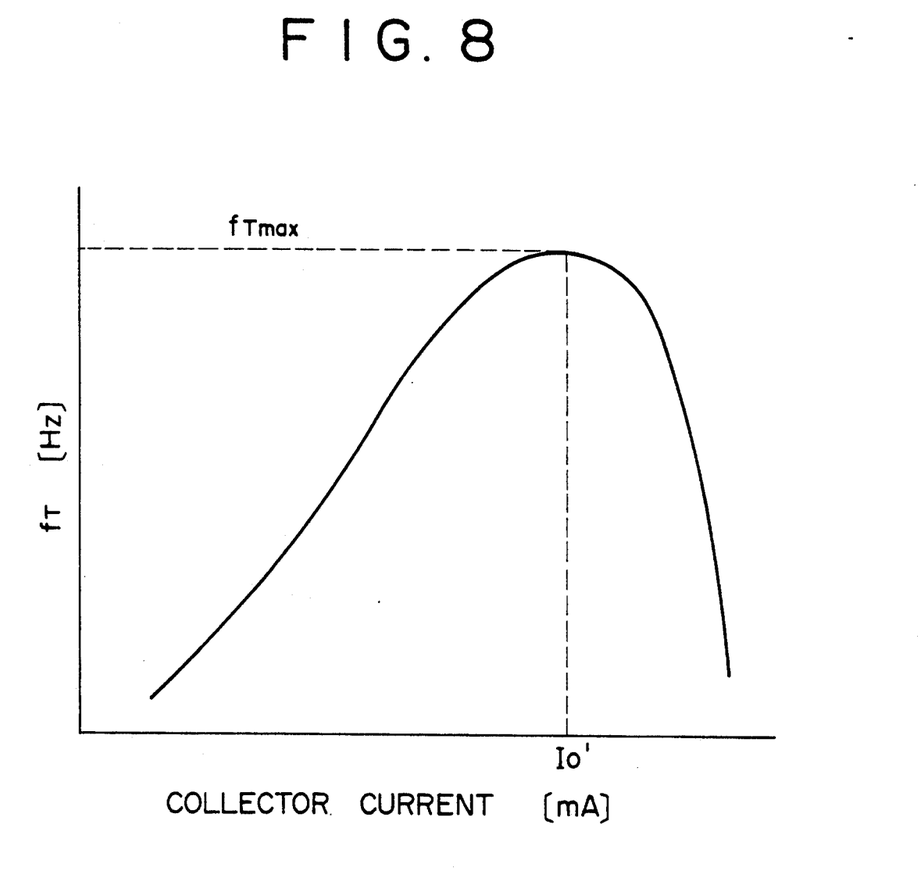
FIG. 8 is a graphic representation of the relationship between collector current and transition frequency for the typical NPN transistor.

In an NPN transistor arrangement formed within an IC semiconductor device, the collector current and the transition frequency $f_T$ per transistor take on the characteristic graphically shown in FIG. 8, the frequency being such that the current amplification degree $h_{FE}$ of the grounded emitter becomes 1. Assume that $I_0$' stands for the collector current in effect when the frequency $f_T$ is maximum. When the collector current becomes greater than the value $I_0$', the frequency $f_T$ abruptly drops and so does the current amplification degree $h_{FE}$. This increases the base current of the transistor Q1 but inversely lowers the gain G. Consequently, as with the collector capacitance $C_{CS}$, the maximum allowable current value is uniquely determined by the semiconductor device manufacturing device. That is, the wide band characteristic is necessarily limited.

Figure 3:
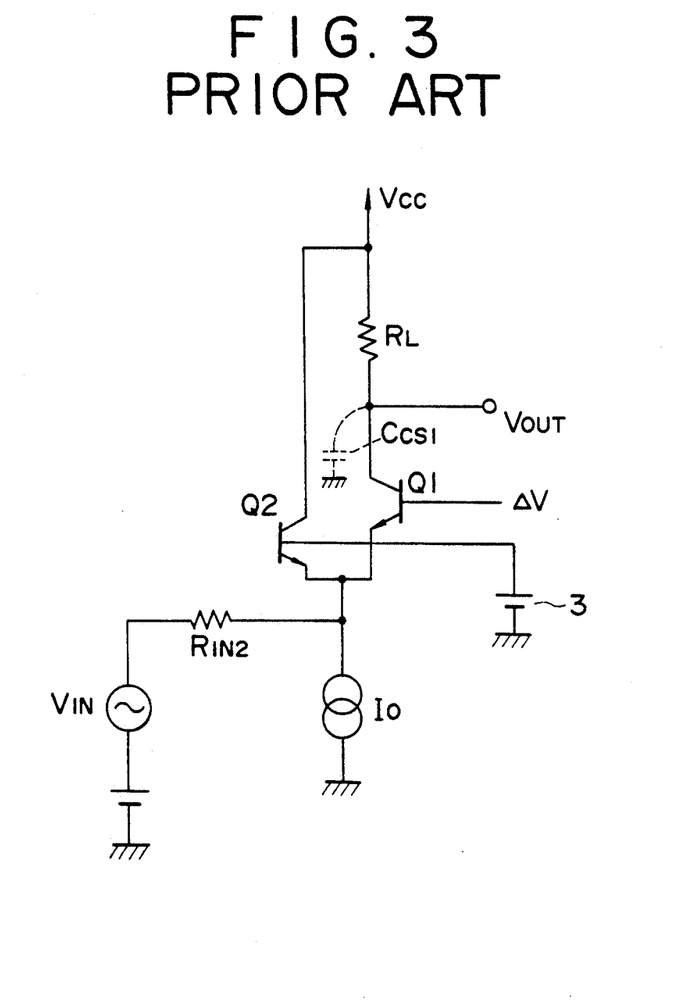
FIG. 3 is a circuit diagram of a second prior art wide band amplifier circuit.

The amplifier circuit of FIG. 3 is proposed as one prior art solution to the above-described problem. This circuit has the output load capacitance RL and the collector capacitance $C_{CS}$ of the transistor Q1 formed in a single component. The gain characteristic of the circuit in FIG. 3 is plotted by the curve B in FIG. 2. This construction allows the circuit to extend its frequency characteristic. One disadvantage of the prior art circuit of FIG. 3 is that the output DC level fluctuates due to the voltage Δ V for determining the gain. As a result, when the dynamic range of the amplifier is required of its output stage, the dynamic range can be lowered depending on the magnitude of the voltage Δ V.

OBJECTS AND SUMMARY OF THE INVENTION

It is therefore an object of the present invention to overcome the above-described drawbacks and disadvantages and to provide a wide band amplifier offering an improved frequency characteristic, the amplifier ensuring amplification over an extended band width and allowing its gain to be varied.

In carrying out the invention, there is provided a wide band amplifier comprising: a first differential connection circuit made of a first and a second transistor differentially interconnected; a second differential connection circuit made of a third and a fourth transistor differentially interconnected; and a level shift circuit interposingly provided between a load resistance and a power supply, the load resistance being connected to the collector of the first transistor; the bases of the first and the third transistors being supplied with a voltage for gain determination; the bases of the first and the third transistors being further supplied with a predetermined operating voltage; the voltage of the level shift circuit being fed to the collector of the fourth transistor; the voltage to the load resistance connected to the collector of the first transistor being varied depending on the magnitude of the current flowing through the fourth transistor.

A fifth transistor is provided between the power supply and the load resistance connected to the collector of the first transistor. The base voltage of the fifth transistor is supplied to the collector of the fourth transistor. As the current flowing through the fourth transistor increases, the voltage to the load resistance is lowered. Conversely, when the current flowing through the fourth transistor drops, the voltage to the load resistance is boosted. The signal output stage of this setup corrects the DC current by varying the current flowing through the fourth transistor when the gain is varied. In this manner, only one collector capacitance is attached to the load resistance.

DESCRIPTION OF THE PREFERRED EMBODIMENTS

Figure 4:
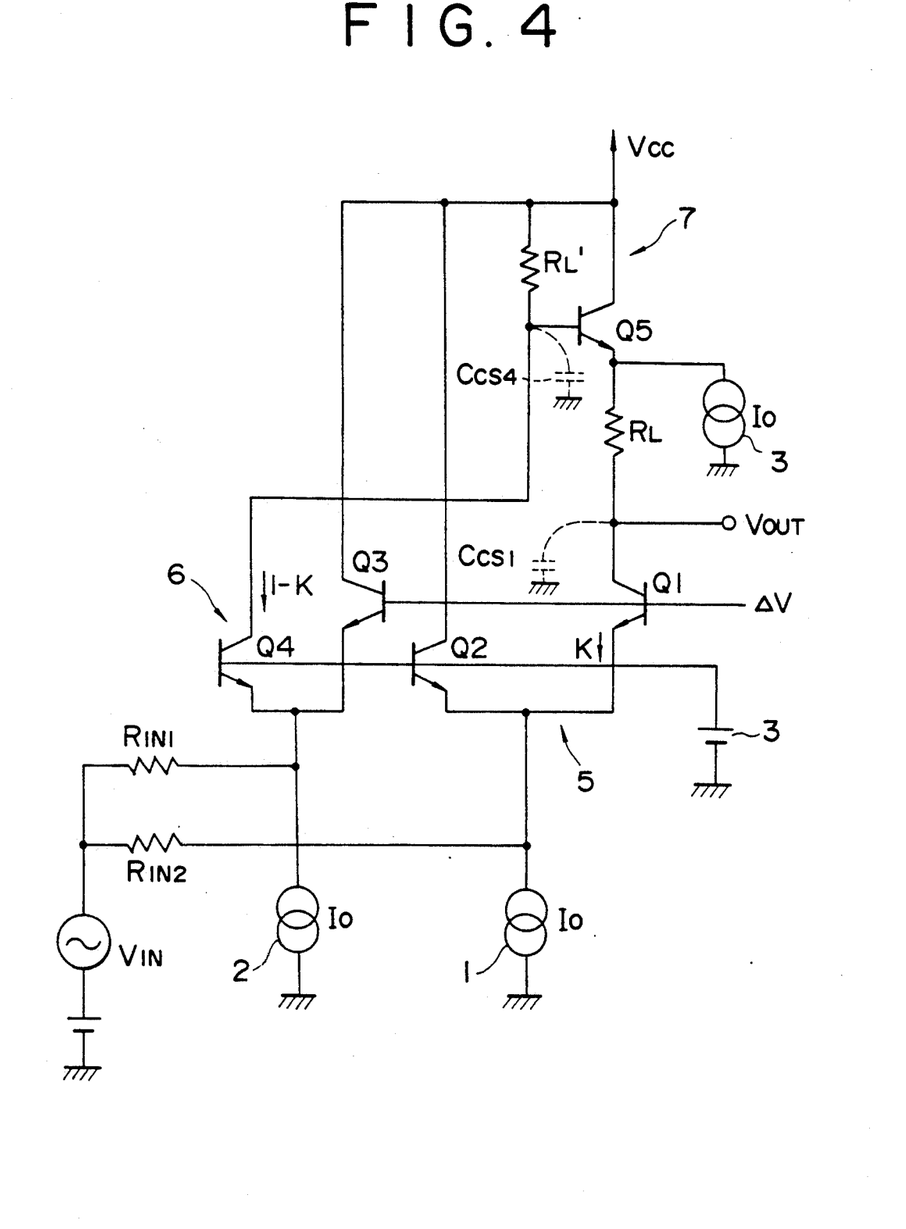
FIGS. 4 and 5 are circuit diagrams of wide band amplifier circuits embodying the present invention.

FIG. 4 is a circuit diagram of a wide band amplifier circuit embodying the invention. As illustrated, the embodiment comprises a first differential connection circuit 5 and a second differential connection circuit 6. The first differential connection circuit 5 is made of a first and a second transistor Q1 and Q2 differentially interconnected, and the second differential connection circuit 6 is constituted by a third and a fourth transistor Q3 and Q4 differentially interconnected. The embodiment also comprises a level shift circuit 7 made of a fifth transistor Q5 and a resistor RL'. The fifth transistor Q5 is interposed between a power supply $V_{CC}$ and a load resistance RL connected to the collector of the first transistor Q1. The resistor RL' is interposingly provided between the power supply $V_{CC}$ and the base of the fifth transistor Q5. What makes the embodiment of FIG. 4 primarily different from the prior art circuit of FIG. 1 is that the embodiment has rid its output load resistance RL of the collector capacitance $C_{CS4}$ which, in the prior art circuit, is added to the collector of the fourth transistor Q4. Furthermore, the embodiment has the fifth transistor Q5 interposed between the power supply $V_{CC}$ and the load resistance RL connected to the collector of the first transistor Q1, with the resistor RL' interposingly connected between the power supply $V_{CC}$ and the base of the fifth transistor Q5. The resistance value of the resistor RL' is made the same as that of the load resistance RL connected to the collector of the first transistor Q1. In the prior art circuit of FIG. 1, the collector voltage of the first transistor Q1 is supplied to the collector of the fourth transistor Q4. By contrast, the embodiment has the collector of the fourth transistor Q4 supplied with the voltage given to the base of the fifth transistor Q5. When the voltage to the collector of the fourth transistor Q4 is retrieved from the base of the fifth transistor Q5, an increase in the current flowing through the transistor Q4 translates into a drop in the voltage to the load resistance RL. This action is substantially equivalent to lowering the voltage of the power supply $V_{CC}$, whereby the DC voltage is corrected.

Where an increase in the gain determining voltage ΔV lowers the current flowing through the fourth transistor Q4, the voltage to the load resistance RL is raised. In this case, too, the DC voltage is suitably corrected. That is, the embodiment corrects the DC current not by means of the output load resistance RL through the third and fourth transistors Q3 and Q4 but by using the resistor RL' which is the same in resistance value as the load resistance RL. Thus with the fifth transistor Q5 provided, the output stage of the amplifier ensures DC current correction.

A current source 3 is included in the embodiment so that the latter will continuously operate regardless of the value K. Without the current source 3, setting the value K to 0 would cause the collector current of the transistor Q1 to disappear and would thereby cut off the transistor Q5.

the embodiment of the above-described construction has its frequency characteristic determined by one load resistance RL and one collector capacitance $C_{CS1}$, both connected to the collector of the first transistor Q1, as well as by one load resistance RL' and one collector capacitance $C_{CS4}$ both connected to the collector of the fourth transistor Q4.

Experiments have been made to example how much the frequency characteristic $f_C$ of the embodiment is extended as opposed to the frequency characteristic $f_C$ of the prior art counterpart. The transfer function $G(S_1)$ of the prior art circuit is given as $$G(S_1) = \frac{(R_L/R_{IN1}) \cdot (1 - K) + (R_L/R_{IN2}) \cdot K}{1 + j\frac{f}{f_c}} \quad (10)$$

Figure 6A:
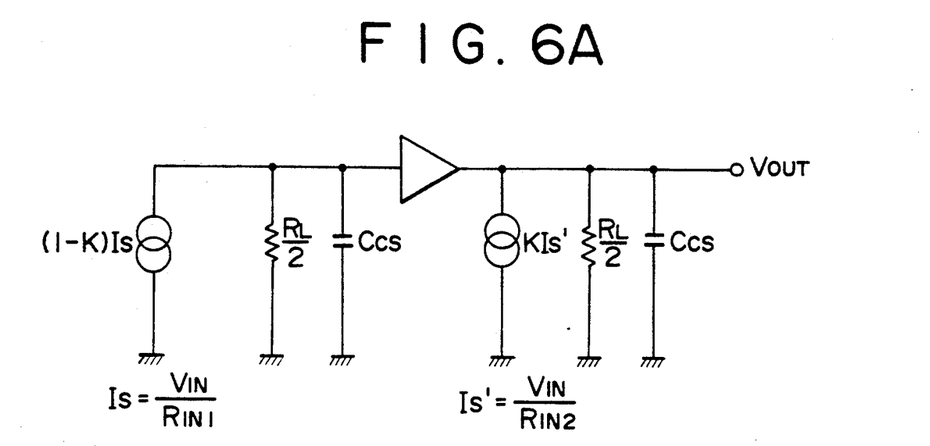
FIGS. 6(A) and 6(B) are views depicting circuits equivalent to the circuit of FIG. 4.
Figure 6B:
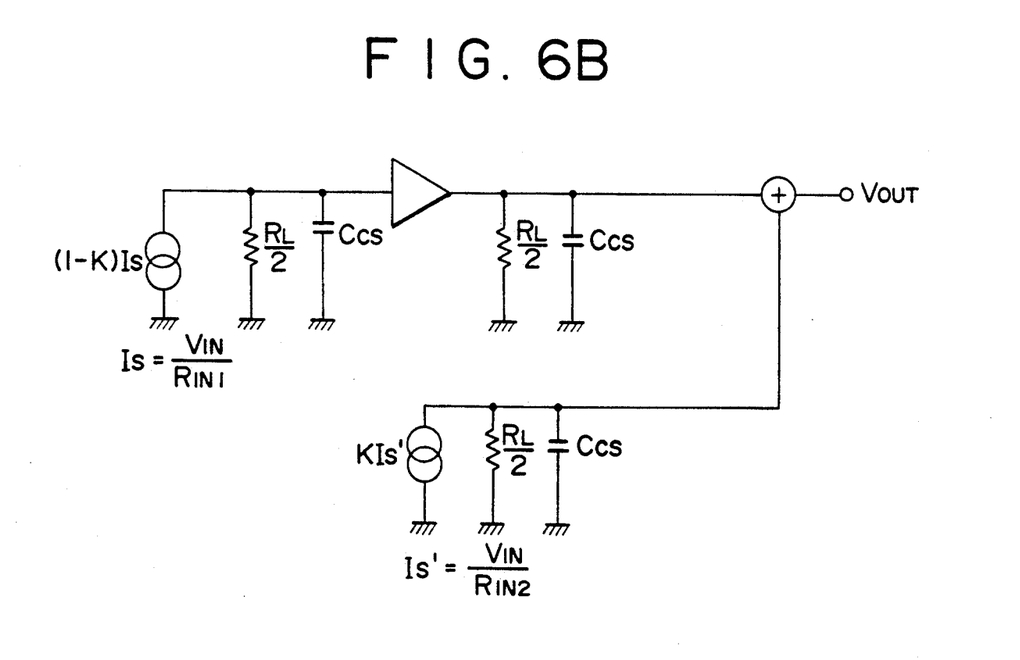

The frequency $f_C$ in equation (10) is the cut-off frequency of the prior art circuit in FIG. 1. Because the load resistance value for the embodiment is half of what is required by the prior art and as the equivalent circuits of FIGS. 6(A) and 6(B) indicate, the transfer function $G(S_2)$ of the embodiment in FIG. 4 is given as $$G(S_2) = \frac{(R_L/R_{IH1}) \cdot (1 - K)}{1 + j\frac{f}{2f_c}} \cdot \frac{1}{1 + j\frac{f}{2f_c}} + \frac{(R_L/R_{IN2}) \cdot K}{1 + j\frac{f}{2f_c}} \quad (11)$$

If $\alpha$ stands for $R_L/R_{IN1}$ and $f_C$ for the cut-off frequency for the transfer function $G(S_2)$ when $R_L/R_{IN2} = 1$, equation (11) may be rearranged as follows:

$$G(S_2) = \left| \frac{\alpha(1 - K)}{\left(1 + j\frac{f'_c}{2f_c}\right)} \cdot \frac{1}{\left(1 + j\frac{f'_c}{2f_c}\right)} + \frac{K}{1 + j\frac{f'_c}{2f_c}} \right| = \frac{K + \alpha(1 - K)}{\sqrt{2}} \quad (12)$$

$$\left| \frac{\alpha(1 - K) + K\left(1 + j\frac{f'_c}{2f_c}\right)}{\left(1 + j\frac{f'_c}{2f_c}\right)\left(1 + j\frac{f'_c}{2f_c}\right)} \right| = \frac{K + \alpha(1 - K)}{\sqrt{2}} \quad (12)'$$

$$\frac{\sqrt{(\alpha(1 - K) + K)^2 + \frac{K^2}{4}A}}{\sqrt{\left(1 - \frac{A}{4}\right)^2 + A}} = \frac{K + \alpha(1 - K)}{\sqrt{2}} \quad (12)''$$

If $A = \left(\frac{f'_c}{f_c}\right)^2$, then $$A^2 + 8A - 8A \cdot \frac{K^2}{(\alpha(1 - K) + K)^2} - 16 = 0 \quad (13)$$

$$\therefore A = 4\sqrt{\left(1 - \frac{K^2}{(\alpha(1 - K) + K)^2}\right)^2 + 1 -} \quad (14)$$

$$4\left\{1 - \left(\frac{K}{\alpha(1 - K) + K}\right)^2\right\}$$

$$\therefore f'_c = 2\sqrt{\sqrt{(1 - Z^2)^2 + 1} - (1 - Z^2)} \cdot f_c \quad (15)$$

where, $Z = \frac{K}{\alpha(1 - K) + K}$

Figure 7:
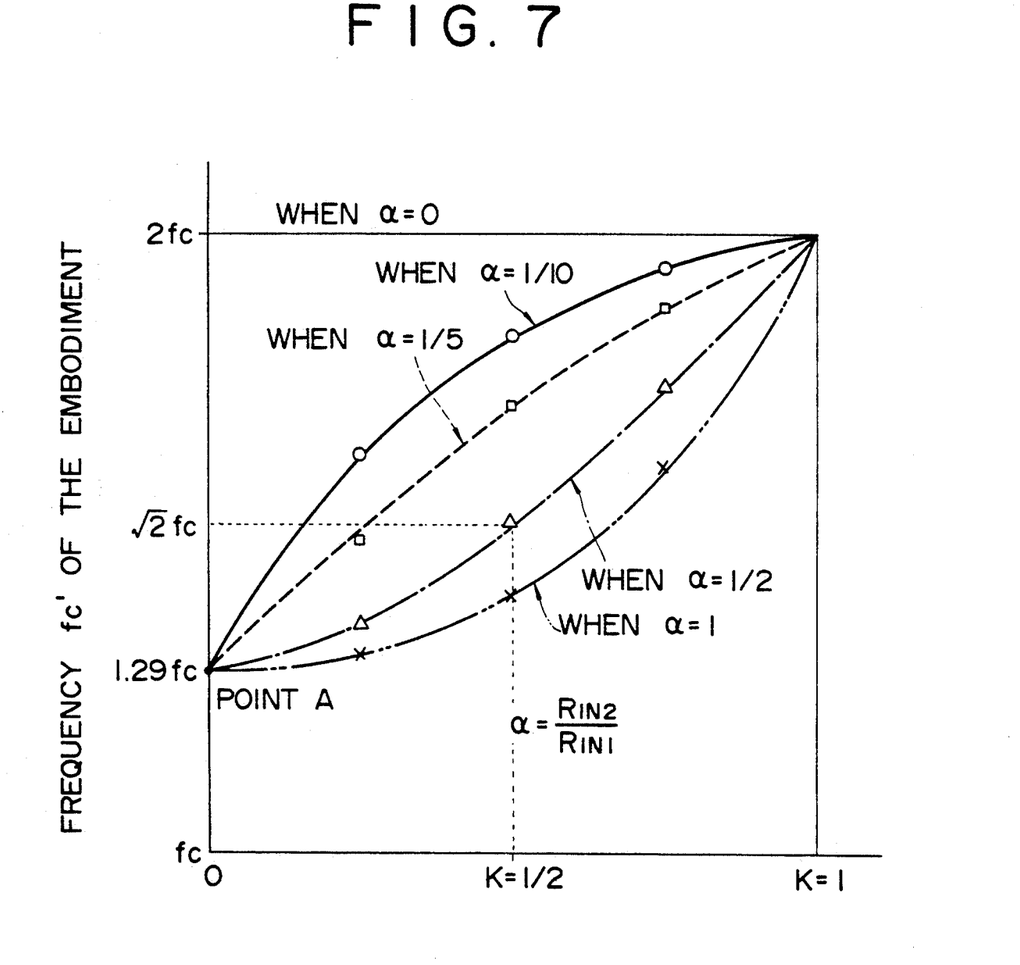
FIG. 7 is a graphic representation illustrating how the frequency characteristics of the circuit of FIG. 4 is extended, as opposed to that of the circuit in FIG. 1, when the value K is varied from 0 to 1.

The characteristics expressed by the above equations are shown in FIG. 7. As indicated by this graphic representation, when $\alpha = 0$, i.e., when $R_{IN1}$ is absent ($R_{IN1} \approx \infty$) the frequency characteristic $f_C$ of the embodiment is given as $$f_C \approx 2f_C$$

When $\alpha \neq 0$, the frequency characteristic of the embodiment varies from 1.29 $f_C$ to $2f_C$ depending on the value of $\alpha$ under a gain control scheme that ensures $0 \leq K \leq 1$. That is, the frequency characteristic may be extended by a factor of at least 1.29.

Figure 9:
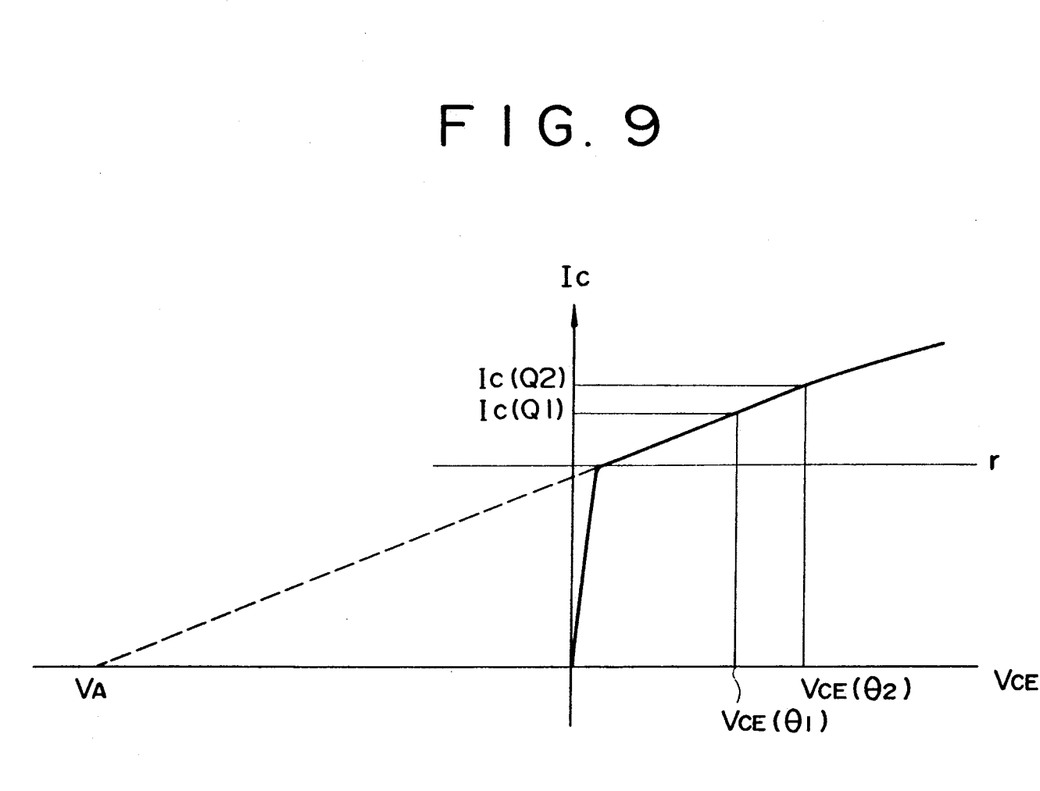
FIG. 9 is a graphic representation of the collector characteristic of the typical NPN transistor.
Figure 10:
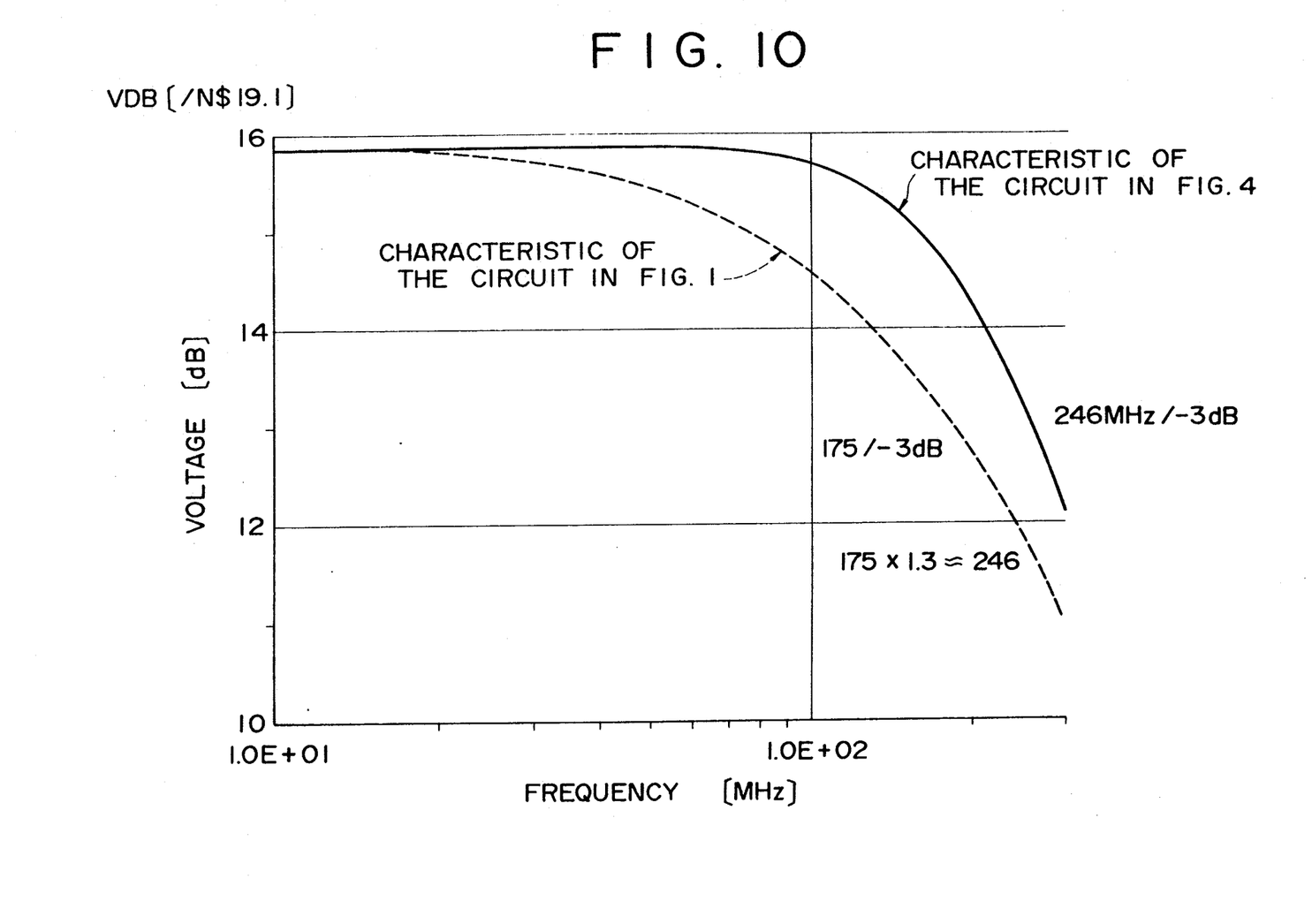
FIG. 10 is a graphic representation of the frequency characteristics of the circuits in FIGS. 1 and 4 taken at point A of FIG. 7.
Figures 11, 11A, 11B:
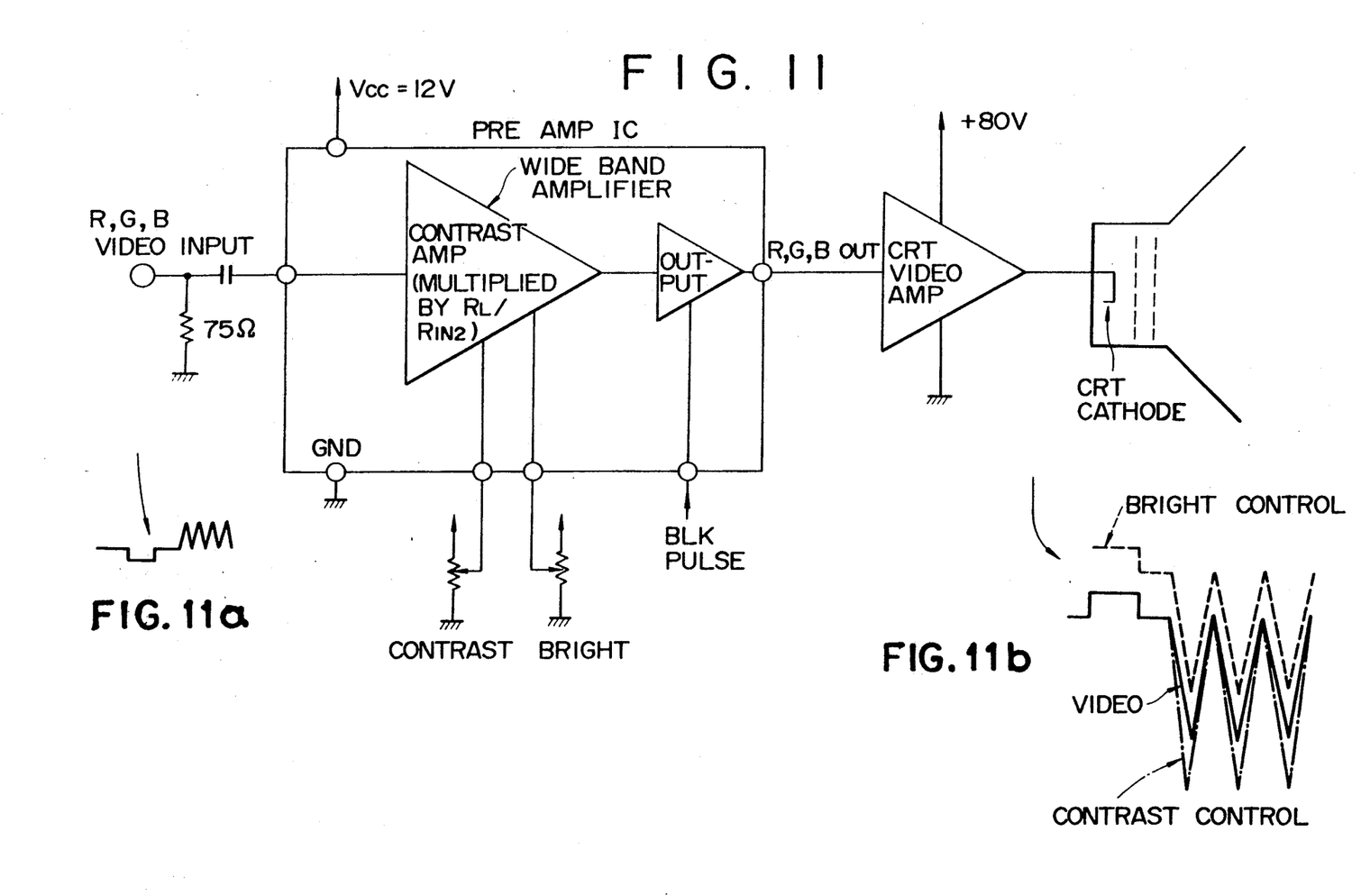
FIG. 11 is a view showing how the embodiment is illustratively used.

The collector current of the bipolar NPN transistor gradually increases as the voltage across the collector to the emitter thereof is raised, as illustrated in FIG. 9. In FIG. 9, characters $V_A$ designate what is known as an early voltage. Although the early voltage is ideally infinite, the bipolar process limits the voltage value in practice to a range of tens of volts to about 200 volts. This aspect causes the circuit of FIG. 4, with its RL' and RL, to develop that value $V_{CE}$ of Q2 and Q3 which is greater than the value $V_{CE}$ of Q1 and Q4. If the gain determining voltage $\Delta V$ is zero, the value K is ideally $\frac{1}{2}$. Where the collector current of the transistor Q1 is equal to that of the transistor Q2, the gain G is obtained by substituting $K = \frac{1}{2}$ into equation (2). Thus we get:

$$G = \frac{R_L}{2}\left(\frac{1}{R_{IN1}} + \frac{1}{R_{IN2}}\right)$$

Figure 5:
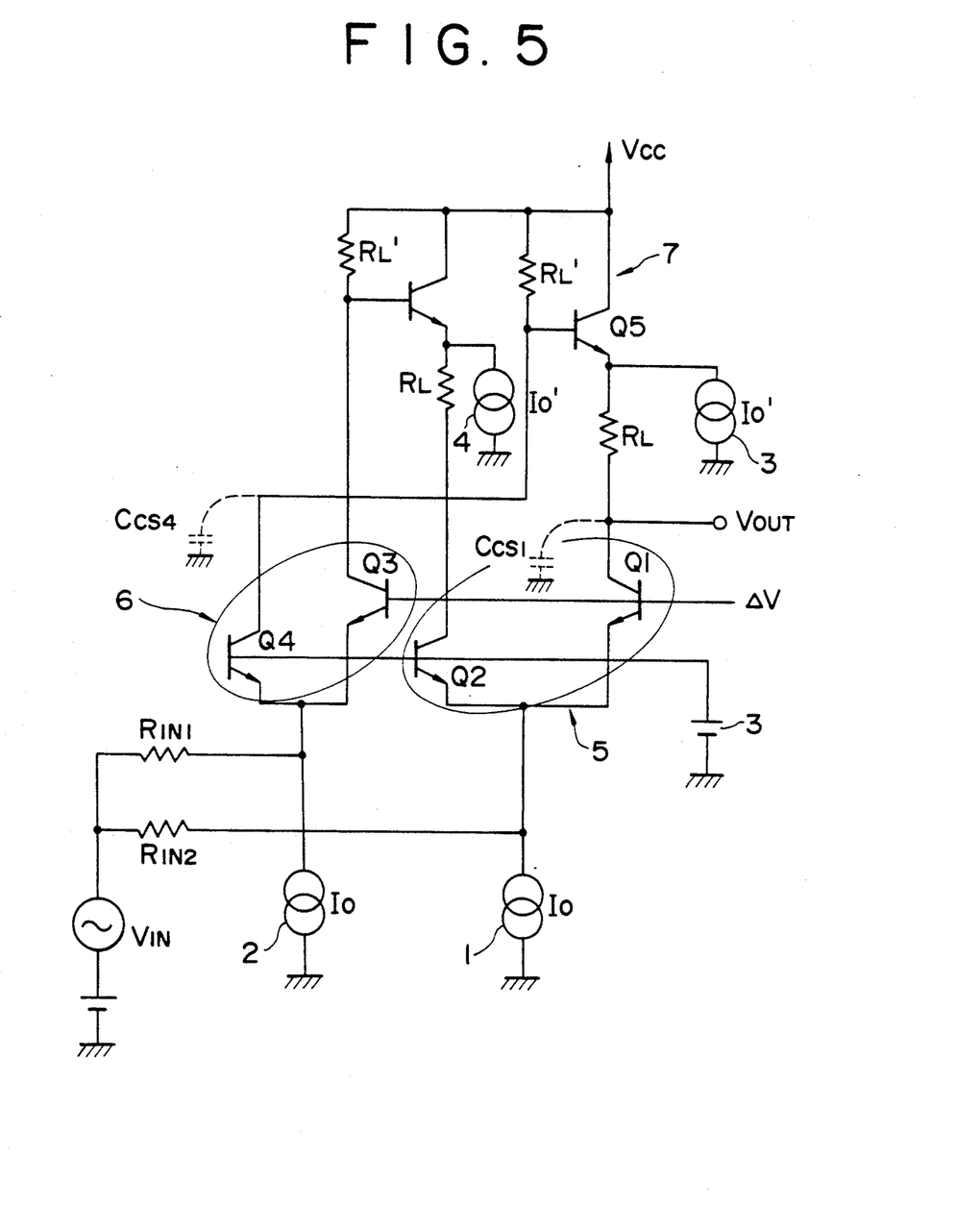

However, since the above-mentioned early voltage is finite, $K \neq \frac{1}{2}$ even if $\Delta V = 0$. This means that the theoretical gain cannot be obtained. This disadvantage is circumvented by adopting the arrangement of FIG. 5 whereby the value $V_{CE}$ of Q2 and Q3 is made the same as that of Q1 and Q4. This embodiment provides a substantially ideal gain characteristic illustrated in FIG. 2.

As described and according to the invention, the level shift circuit is provided between the power supply and the load resistance connected to the collector of the first transistor. The voltage of the level shift circuit is supplied to the collector of the fourth transistor. As the current flowing through the fourth transistor increases, the voltage to the load resistance is lowered. Conversely, when the current flowing through the fourth transistor drops, the voltage to the load resistance is raised. The signal output stage of this circuit arrangement corrects the DC current by varying the current flowing through the fourth transistor when the gain is varied. As a result, only one collector capacitance is attached to the load resistance. Where $R_{IN1}$ is absent, the frequency characteristic of the embodiment capable of varying its gain is determined only by the load resistance and by the collector capacitance attached to the collector of the first transistor; where $R_{IN1}$ is present, the frequency characteristic is determined not only by the above load resistance and collector capacitance but also by the collector capacitance attached to the collector of the fourth transistor. In the latter case, however, only one collector capacitance is utilized in connection with the output load resistance RL. Thus regardless of the presence or absence of $R_{IN1}$, the frequency characteristic of the embodiment is extended appreciably.

As many apparently different embodiments of the present invention may be made without departing from the spirit and scope thereof, it is to be understood that the invention is not limited to the specific embodiments thereof except as defined in the appended claims.

What is claimed is:

1. A wide band amplifier comprising:
   a first differential connection circuit made of a first and a second transistor differentially interconnected;
   a second differential connection circuit made of a third and a fourth transistor differentially interconnected; and
   a level shift circuit interposed between a load resistance and a power supply, said load resistance being connected to the collector of said first transistor;
   the bases of said first and said third transistors being supplied with a voltage for gain determination;
   the bases of said first and said third transistors being further supplied with a predetermined operating voltage;
   the collectors of said second and third transistors being connected directly to said power supply;
   said level shift circuit being connected to the collector of said fourth transistor;
   a voltage at said load resistance and at the collector of said first transistor being varied depending on the magnitude of the current flowing through said fourth transistor.

2. A wide band amplifier comprising:
   a first differential connection circuit made of a first and a second transistor differentially interconnected;
   a second differential connection circuit made of a third and a fourth transistor differentially interconnected; and
   a level shift circuit interposed between a load resistance and a power supply, said load resistance being connected to the collector of said first transistor;
   the bases of said first and said third transistors being supplied with a voltage for gain determination;
   the bases of said first and said third transistors being further supplied with a predetermined operating voltage;
   first and second input resistors for respectively connecting an input signal voltage to each of said first and second differential connection circuits;
   each of said first and second differential connection circuits being provided with an individual current source connected to its respective input resistor;
   said level shift circuit being connected to the collector of said fourth transistor;
   a voltage at said load resistance and at the collector of said first transistor being varied depending on the magnitude of the current flowing through said fourth transistor.

3. A wide band amplifier comprising:
   a first differential connection circuit made of a first and a second transistor differentially interconnected;
   a second differential connection circuit made of a third and a fourth transistor differentially interconnected; and
   a level shift circuit interposed between a load resistance and a power supply, said load resistance being connected to the collector of said first transistor;
   the bases of said first and said third transistors being supplied with a voltage for gain determination;
   the bases of said first and said third transistors being further supplied with a predetermined operating voltage;
   first and second input resistors for respectively connecting an input signal voltage to each of said first and second differential connection circuits;
   each of said first and second differential connection circuits being provided with an individual current source connected to its respective input resistor;
   and a current source connected to the junction between said level shift circuit and said load resistor;
   said level shift circuit being connected to the collector of said fourth transistor;
   a voltage at said load resistance and at the collector of said first transistor being varied depending on the magnitude of the current flowing through said fourth transistor.

4. A wide band amplifier comprising:
   a first differential connection circuit made of a first and a second transistor differentially interconnected;
   a second differential connection circuit made of a third and a fourth transistor differentially interconnected; and
   a first level shift circuit interposed between a load resistance and a power supply, said load resistance being connected to the collector of said first transistor;
   the bases of said first and said third transistors being supplied with a voltage for gain determination;
   the bases of said first and said third transistors being further supplied with a predetermined operating voltage;
   a second load resistor and a second level shift circuit interposed between a collector of said second transistor and said power supply, said second level shift circuit being connected to the collector of said third transistor,
   said first level shift circuit being connected to the collector of said fourth transistor;
   a voltage at said load resistance and at the collector of said first transistor being varied depending on the magnitude of the current flowing through said fourth transistor.

5. A wide band amplifier comprising:
   a first differential connection circuit made of a first and a second transistor differentially interconnected;
   a second differential connection circuit made of a third and a fourth transistor differentially interconnected; and
   a level shift circuit interposed between a load resistance and a power supply, said load resistance being connected to the collector of said first transistor;
   the bases of said first and said third transistors being supplied with a voltage for gain determination;

the bases of said first and said third transistors being further supplied with a predetermined operating voltage;

first and second input resistors for respectively connecting an input signal voltage to each of said first and second differential connection circuits;

each of said first and second differential connection circuits being provided with an individual current source connected to its respective input resistor;

said level shift circuit comprising a transistor having its collector and emitter terminals connected in series between the load resistance and said power supply, and including a resistor connected between the base of said level shift transistor and said power supply, the value of said resistor being equal to the value of said load resistor;

said level shift circuit being connected to the collector of said fourth transistor;

a voltage at said load resistance and at the collector of said first transistor being varied depending on the magnitude of the current flowing through said fourth transistor.

* * * * *